(12) United States Patent
Liff et al.

(10) Patent No.: US 11,421,376 B2
(45) Date of Patent: Aug. 23, 2022

(54) INORGANIC PIEZOELECTRIC MATERIALS FORMED ON FIBERS AND APPLICATIONS THEREOF

(71) Applicant: Intel Corporation, Santa Clara, CA (US)

(72) Inventors: Shawna M. Liff, Scottsdale, AZ (US); Feras Eid, Chandler, AZ (US); Aleksandar Aleksov, Chandler, AZ (US); Sasha N. Oster, Marion, IA (US); Baris Bicen, Chandler, AZ (US); Thomas L. Sounart, Chandler, AZ (US); Valluri R. Rao, Saratoga, CA (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 1066 days.

(21) Appl. No.: 16/072,165

(22) PCT Filed: Apr. 1, 2016

(86) PCT No.: PCT/US2016/025655
§ 371 (c)(1),
(2) Date: Jul. 23, 2018

(87) PCT Pub. No.: WO2017/171856
PCT Pub. Date: Oct. 5, 2017

(65) Prior Publication Data
US 2019/0032272 A1 Jan. 31, 2019

(51) Int. Cl.
*H01L 41/047* (2006.01)
*D06M 10/06* (2006.01)
(Continued)

(52) U.S. Cl.
CPC ............ *D06M 10/06* (2013.01); *D06M 11/46* (2013.01); *D06M 11/47* (2013.01); *D06M 11/83* (2013.01);
(Continued)

(58) Field of Classification Search
CPC .................. H01L 41/047; H01L 41/1873; H01L 41/1876
See application file for complete search history.

(56) References Cited

U.S. PATENT DOCUMENTS 7,880,115 B2 2/2011 Lai et al.
2004/0042699 A1* 3/2004 Chen .................... G02F 1/0134
385/1
(Continued)

FOREIGN PATENT DOCUMENTS

JP      05-209364      8/1993

OTHER PUBLICATIONS

International Preliminary Report on Patentability for International Patent Application No. PCT/US2016/025655, dated Oct. 11, 2018, 8 pages.
(Continued)

*Primary Examiner* — Bryan P Gordon
(74) *Attorney, Agent, or Firm* — Schwabe, Williamson & Wyatt, P.C.

(57) ABSTRACT

Embodiments of the invention include an active fiber with a piezoelectric layer that has a crystallization temperature that is greater than a melt or draw temperature of the fiber and methods of forming such active fibers. According to an embodiment, a first electrode is formed over an outer surface of a fiber. Embodiments may then include depositing a first amorphous piezoelectric layer over the first electrode. Thereafter, the first amorphous piezoelectric layer may be crystallized with a pulsed laser annealing process to form a first crystallized piezoelectric layer. In an embodiment, the
(Continued)

pulsed laser annealing process may include exposing the first amorphous piezoelectric layer to radiation from an excimer laser with an energy density between approximately 10 and 100 mJ/cm2 and pulse width between approximately 10 and 50 nanoseconds. Embodiments may also include forming a second electrode over an outer surface of the crystallized piezoelectric layer.

10 Claims, 8 Drawing Sheets

(51) Int. Cl.
| | |
|---|---|
| *D06M 11/46* | (2006.01) |
| *D06M 11/47* | (2006.01) |
| *H01L 41/316* | (2013.01) |
| *D06M 17/00* | (2006.01) |
| *H01L 41/087* | (2006.01) |
| *D06M 11/83* | (2006.01) |
| *H01L 41/187* | (2006.01) |
| *H01L 41/29* | (2013.01) |
| *D01F 11/00* | (2006.01) |

(52) U.S. Cl.
CPC ........... *D06M 17/00* (2013.01); *H01L 41/047* (2013.01); *H01L 41/087* (2013.01); *H01L 41/1873* (2013.01); *H01L 41/1876* (2013.01); *H01L 41/29* (2013.01); *H01L 41/316* (2013.01); *D01F 11/00* (2013.01)

(56) References Cited

U.S. PATENT DOCUMENTS

| | | | |
|---|---|---|---|
| 2014/0170919 A1* | 6/2014 | Manipatruni | D02G 3/441 |
| | | | 442/330 |
| 2014/0187055 A1 | 7/2014 | Martinsen et al. | |
| 2016/0023466 A1 | 1/2016 | Chen | |
| 2017/0029985 A1* | 2/2017 | Tajitsu | H04R 17/005 |
| 2018/0284425 A1* | 10/2018 | Dalrymple | H04N 9/14 |

OTHER PUBLICATIONS

International Search Report and Written Opinion for International Patent Application No. PCT/US2016/025655 dated Jan. 2, 2017, 11 pgs.

* cited by examiner

11,421,376 B2

INORGANIC PIEZOELECTRIC MATERIALS FORMED ON FIBERS AND APPLICATIONS THEREOF

CROSS-REFERENCE TO RELATED APPLICATION

This patent application is a U.S. National Phase Application under 35 U.S.C. § 371 of International Application No. PCT/US2016/025655, filed Apr. 1, 2016, entitled "INORGANIC PIEZOELECTRIC MATERIALS FORMED ON FIBERS & APPLICATIONS THEREOF," which designates the United States of America, the entire disclosure of which is hereby incorporated by reference in its entirety and for all purposes.

FIELD OF THE INVENTION

Embodiments of the present invention relate generally to the manufacture of active fibers. In particular, embodiments of the present invention relate to piezoelectric materials that are deposited on low melting point fibers and crystallized with a pulsed laser anneal.

BACKGROUND OF THE INVENTION

Active fibers (i.e., fibers coupled with piezoelectric material) can be used in many applications. For example, active fiber can be used to form voltage sensors, ultra-sonic or audio transducers or receivers, wearable nanogenerators, Fabry-Perot tunable filters, phase modulators, stress concentrators, refractive index changers, and tunable reflectors, to name a few. However, the currently available material choices for the piezoelectric material and the fiber on which the piezoelectric material is deposited are limited. Typically, the material for the fiber is limited to high temperature glass fibers. High temperature fibers are needed because the piezoelectric material requires a high temperature anneal (e.g., greater than approximately 500° C.) in order to be crystallized, and the melt or draw temperature of the fiber needs to be greater than the piezoelectric annealing temperature to prevent damage to the fiber.

Some piezoelectrically coated fibers have used piezoelectric materials that have a lower annealing temperature at the cost of an inferior piezoelectric response compared to high annealing temperature piezoelectric materials, such as lead zirconate titanate (PZT). For example, zinc oxide (ZnO) and some polymeric piezoelectric materials (e.g., polyvinylidene difluoride (PVDF)) have a process temperature to induce crystallinity that is below the melt or draw temperature of non-glass fiber materials, but have a piezoelectric effect that is significantly inferior to high annealing temperature piezoelectric materials.

Additionally, some applications have adhered high temperature piezoelectric materials to a low temperature fiber after the piezoelectric material was annealed in order to obtain the superior performance of high annealing temperature piezoelectric materials while still using low temperature fibers. However, this results in a bulky packaged device with performance limited by the electro-mechanical coupling of the adhesive over the temperature range of interest.

DETAILED DESCRIPTION OF THE INVENTION

Described herein are systems that include active fibers that include a fiber with a melt or draw temperature that is less than the annealing temperature of the piezoelectric material coated on the fiber, and methods of forming such active fibers. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Embodiments of the invention include applying a high performance piezoelectric material, such as PZT, that exhibits crystallinity at annealing temperatures in excess of the fiber melt or draw temperature. Accordingly, high performance active fibers may be formed with materials other than glass fibers, thereby allowing for improved devices in applications such as those described above in addition to new applications previously not capable of being formed with glass fibers.

Furthermore, embodiments of the invention may form high performance active fibers using processing tools currently available in a panel or a roll-to-roll process. As such, the high performance active fibers may be manufactured with a high throughput and reduced cost. According to embodiments of the invention, the processing operations used to form the active fibers may also allow for various configurations of the piezoelectric materials, electrodes, insulating layers, and the like. For example, one or more layers formed on the fiber may be centrosymmetric and/or non-centrosymmetric. Additionally, the processing operations may allow for highly customizable piezoelectric stacks. For example, any number of piezoelectric layers or combination of piezoelectric materials may be formed on the fiber. As such, the active fibers formed according to embodiments of the invention can be customized for any desired application with minimal adjustments to the fabrication process.

Figure 1:
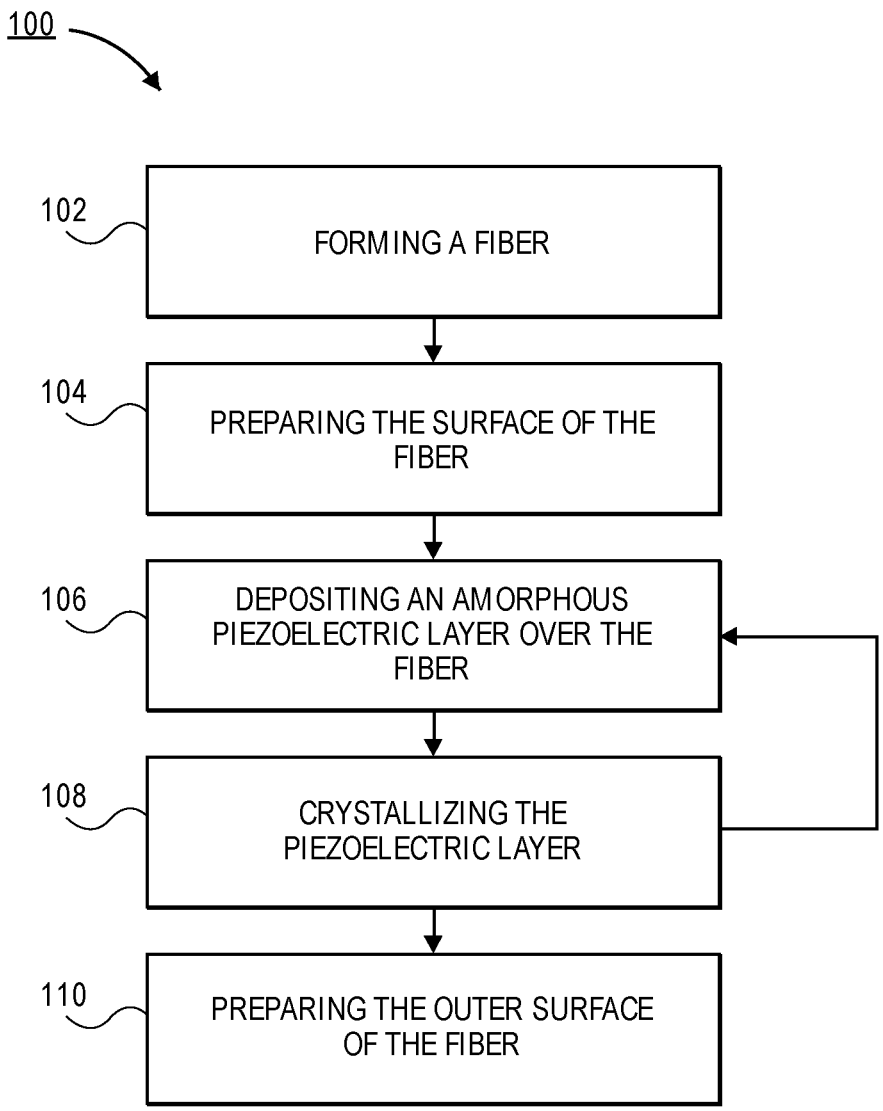
FIG. 1 is a flow diagram that describes a process for forming a piezoelectric material on a fiber with a pulsed laser annealing process that allows for crystallization of the piezoelectric material without damaging the fiber, according to an embodiment of the invention.

Referring now to FIG. 1, a flow diagram is used to describe a process 100 that may be used to form active fibers, according to an embodiment of the invention. According to an embodiment, process 100 begins at operation 102 by forming a fiber. The fiber may be formed with any fiber forming process typically used for generating fibers. For example, a spinning process may be used to form the fiber. Depending on the fiber that is being formed, different derivations of the spinning process may be used (e.g., wet spinning may be used for fibers such as acrylic, rayon, aramid, spandex, or the like, dry spinning may be used for fibers such as acetate, acrylic, polybenzimidazole (PBI), spandex, vinyon, or the like, melt spinning may be used for fibers such as nylon, olefin, polyester, saran, sulfar, or the like, and gel spinning may be used for fibers such as polyethylene, aramid, or the like). Generically, each derivation of a spinning process may include extruding a thick viscous liquid through a small orifice or series of orifices. As the filament emerges from these orifices, the liquid transitions into a rubbery state and then solidifies. While the extruded fibers solidify, the filaments may be drawn or stretched to align the molecular chains along the fiber axis to increase the strength of the fiber. Due to the pulsed laser annealing processes (described in greater detail below) the melt of draw temperatures of the fiber formed in operation 102 may be less than the annealing temperature of the piezoelectric material that will subsequently be deposited on the fiber. For example, the melt or draw temperature of the fiber may be less than approximately 250° C. In some embodiments, the melt or draw temperature of the fiber may be less than approximately 200° C.

Figure 2A:
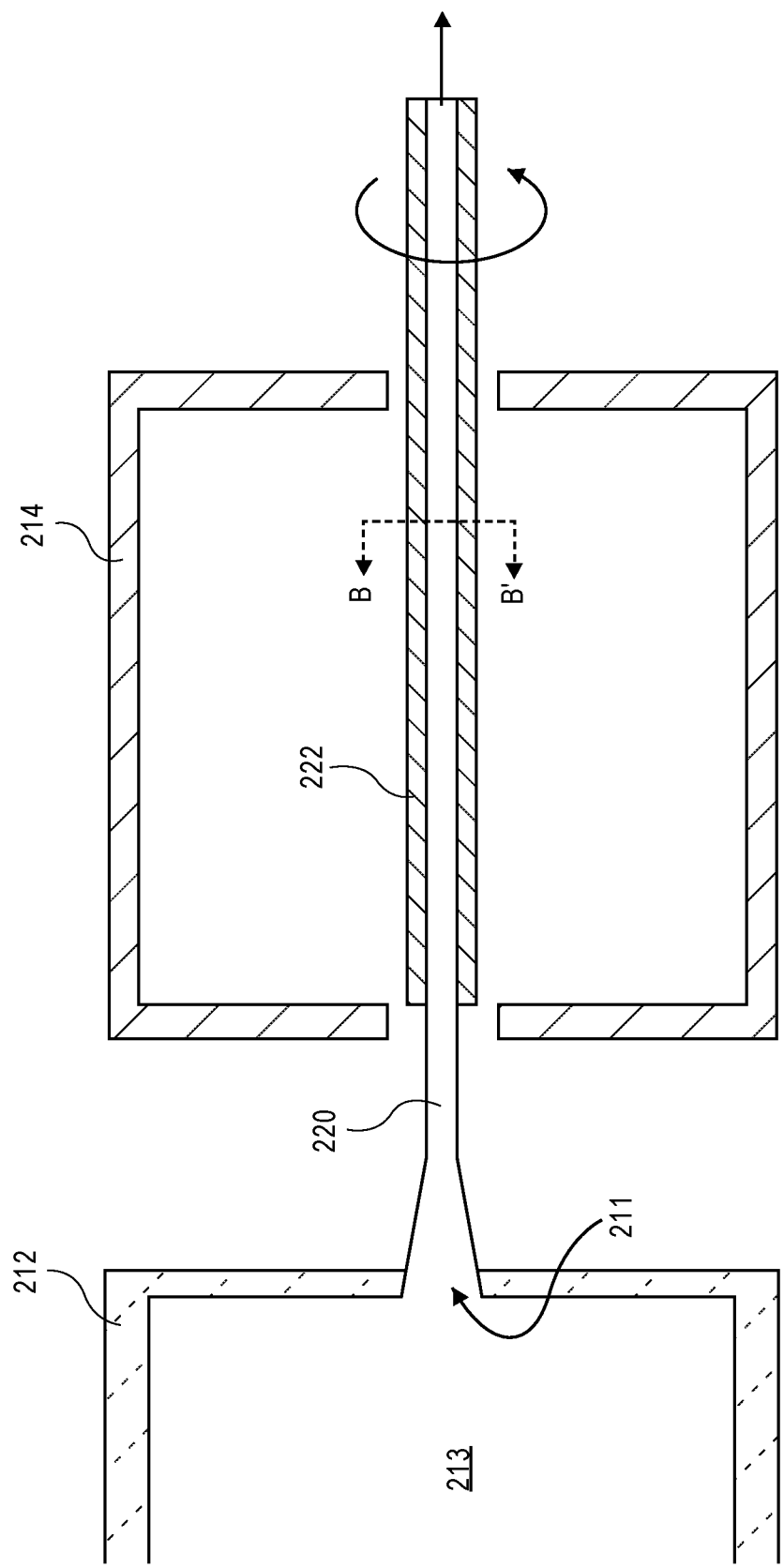
FIG. 2A is a schematic cross-sectional illustration of a fiber drawing process and a fiber core preparation process prior to forming the piezoelectric material on the fiber, according to an embodiment of the invention.

Referring now to FIG. 2A, a cross-sectional schematic of a portion of the fiber fabrication process is shown, according to an embodiment of the invention. In the illustrated embodiment, a generic fiber extruding device 212 is shown. According to an embodiment, the fiber extruding device 212 may store a liquid 213 that is extruded through orifice 211 to form a fiber 220. While the fiber 220 is shown being fed directly into a subsequent chamber, it is to be appreciated that the fiber 220 may also be fed to a spool or other storage device for subsequent processing at a later time.

Referring back to FIG. 1, embodiments of the invention may continue process 100 by advancing to operation 104. According to an embodiment, operation 104 may include preparing the surface of the fiber 220. Preparing the surface of the fiber 220 may include coating the fiber surface with one or more layers prior to the formation of the piezoelectric layer. For example, material layers such as a thermal insulating layer, a first electrode layer, and/or a crystalline nucleation enhancement layer may be formed around the circumference of the fiber 220. Embodiments may include depositing the one or more layers onto the fiber 220 with an evaporator, a chemical vapor deposition (CVD) tool, and/or an atomic layer deposition (ALD), a plasma vapor deposition (PVD) and/or an RF Magnetron Sputter tool.

Figure 2B:
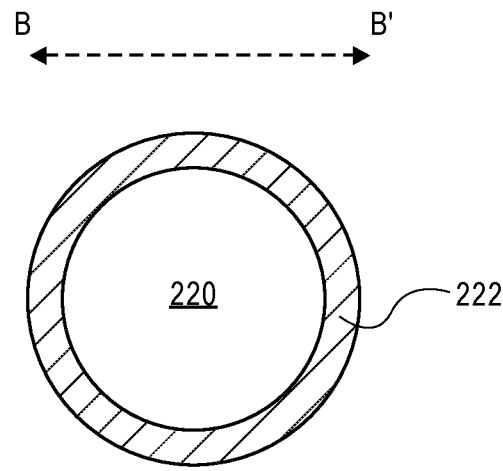
FIG. 2B is a cross-sectional illustration of the fiber after a first electrode is formed around the perimeter of the fiber, according to an embodiment of the invention.

Referring again to FIG. 2A, a generic deposition tool 214 is shown, according to an embodiment of the invention. As illustrated, the uncoated fiber 220 is passed through the tool 214 and a material is deposited on the surface of the fiber. In FIG. 2A, a first electrode 222 is shown being deposited onto the fiber 220. While the thickness of the first electrode 222 is shown as being substantially equal throughout the deposition tool 214, it is to be appreciated that the thickness of the first electrode 222 may increase as the fiber 220 passes through the deposition tool. Accordingly, the thickness of the first electrode 222 may be controlled at least in part by the speed at which the fiber is pulled through deposition tool 214. Additionally, a centrosymmetric coating may be formed by rotating the fiber 220 as it passes through the deposition tool, as indicated by the arrow wrapping around the fiber 220. Such a centrosymmetric coating is shown in the cross-sectional illustration of the fiber 220 along line B-B' in FIG. 2B. In the illustrated embodiment, a centrosymmetric first electrode 222 has been formed directly on the surface of fiber 220. Alternatively, a non-centrosymmetric coating may be obtained by omitting the rotation or by initiating periodic rotation. Non-centrosymmetric coatings will be described in greater detail below.

Figure 2C:
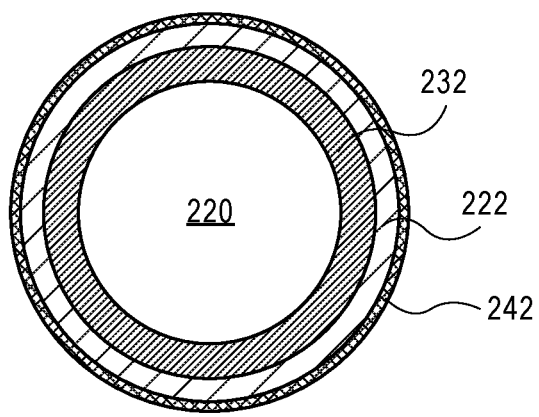
FIG. 2C is a cross-sectional illustration of the fiber after a thermal insulating layer, a first electrode, and a surface treatment layer are formed around the perimeter of the fiber, according to an embodiment of the invention.

Referring now to FIG. 2C, a cross-sectional illustration of fiber 220 after operation 104 is shown, according to an additional embodiment of the invention. In FIG. 2C a plurality of layers have been formed on the fiber 220. For example, a thermal insulation layer 232 may be formed directly on the surface of the fiber 220. A thermal insulation layer 232 may increase the fiber's resistance to heat in subsequent processing operations, such as the pulsed laser annealing process. Accordingly, a more aggressive annealing process may be implemented when a thermal insulation layer 232 is used. Embodiments of the invention may include thermal insulation layers 232 such as an oxide, nitride, or carbon deposited at low temperature or via sol-gel deposition and anneal techniques.

After the thermal insulation layer 232 is formed, the first electrode 222 for actuating the piezoelectric material may be formed. The first electrode 222 may be any suitable conductive material. For example, the first electrode 222 may be copper, silver, gold, aluminum, or the like, or combinations of the like. According to an embodiment, a crystal nucleation enhancement layer 242 may also be formed over a surface of the first electrode 222. A crystal nucleation enhancement layer 242 may decrease the input energy needed to drive nucleation of a subsequently deposited piezoelectric layer. As such, the temperature increase in the fiber caused by the pulsed laser annealing process may be decreased since less energy from the laser will be needed. For example, the crystal nucleation enhancement layer 242 may include titanium, platinum, or the like.

According to an embodiment, each material layer described above may be deposited in the same processing tool. For example, processing gasses or source material used in the tool may be changed to form each layer. Alternatively, each material layer may be formed in different processing tools. In such embodiments, the fiber may be fed directly from one processing tool to the next processing tool, or the fiber may be fed to a spool and then processed in a second tool at a later time. Additionally, a fiber may be passed through a single tool multiple times (e.g., by being pulled through the tool in the reverse direction or by being passed through the tool additional times in the same direction), with different processing gasses or source materials used during each pass to form the multiple material layers.

Figure 2D:
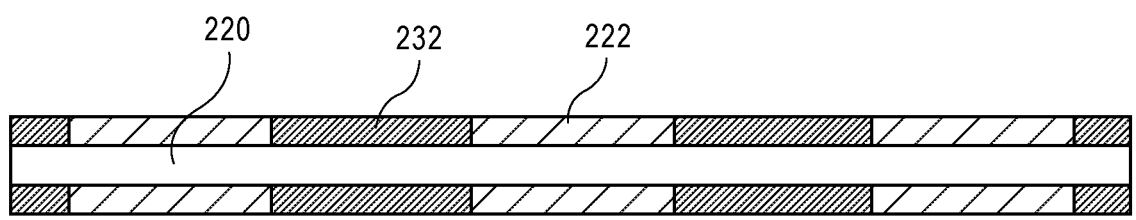
FIG. 2D is a cross-sectional illustration along the length of the fiber that shows intermittent deposition of a first electrode and an insulating layer, according to an embodiment of the invention.

Referring now to FIG. 2D, a cross-sectional illustration along the axis of the fiber 220 is shown, according to an additional embodiment of the invention. Instead of forming a fiber 220 with a uniform cross-section throughout the entire length of the fiber 220, embodiments may also include different materials in the same layer. For example, a pattern of different materials in a single layer may be formed by changing the processing gasses or source material as the fiber is pulled through the deposition tool 214 or pulled through multiple tools. In the embodiment illustrated in FIG. 2D, the processing gasses alternated between processing gasses used to form a thermally insulating layer 232 and a first electrode layer 222. In embodiments where the deposition processing is intermittently halted while the fiber 220 is passed through the tool (e.g., by stopping the flow of processing gasses, releasing the vacuum in an evaporator, etc.), some portions of the fiber 220 may lack coating layers (i.e., the fiber 220 may have a non-uniform coating thickness along the length of the fiber 220).

Referring back to FIG. 1, embodiments of the invention may continue process 100 by advancing to operation 106. According to an embodiment, operation 106 may include depositing an amorphous piezoelectric layer 223 over the fiber 220. The amorphous piezoelectric layer 223 may be deposited with a sputtering tool, such as an RF magnetron sputtering tool or the like. Embodiments of the invention include depositing a piezoelectric layer 223 that has an annealing temperature to initiate crystallization that is greater than the melt or draw temperature of the fiber 220. For example, the piezoelectric material may be PZT, sodium potassium niobate (KNN), or the like. In embodiments where a centrosymmetric layer of the piezoelectric layer 223 is desired, the fiber 220 may be rotated during operation 106.

Figure 3A:
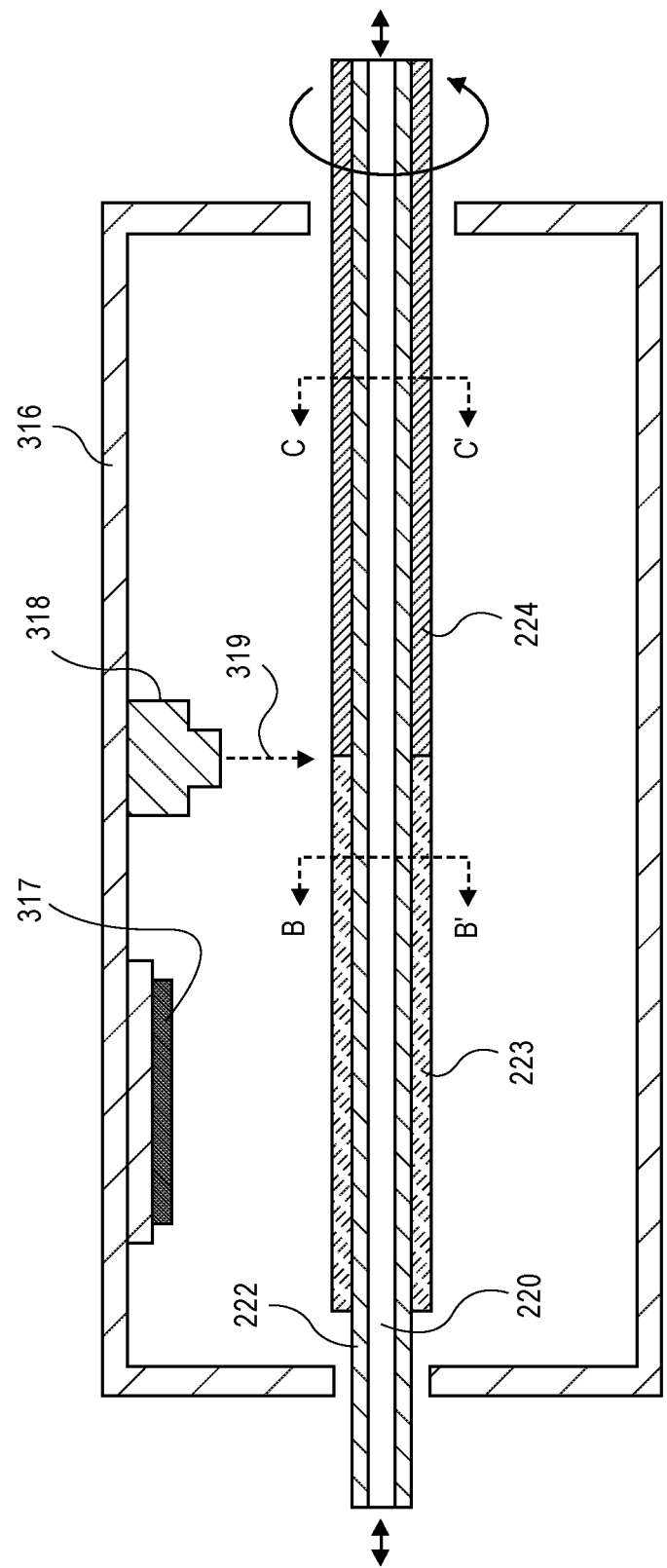
FIG. 3A is a schematic cross-sectional illustration of a process for depositing an amorphous piezoelectric material layer over the first electrode and a laser assisted annealing process for crystallizing the piezoelectric material without damaging the fiber, according to an embodiment of the invention.

Referring now to FIG. 3A, a generic sputtering tool 316 is shown, according to an embodiment of the invention. As illustrated, the fiber 220 is passed through the tool 316 and the amorphous piezoelectric layer 223 is deposited on the surface of the first electrode 222. For example, the piezoelectric material may be transferred from the target 317 to the fiber 220 with standard sputtering processes. While the thickness of the piezoelectric layer 223 is shown as being substantially equal throughout the sputtering tool 316, it is to be appreciated that the thickness of the amorphous piezoelectric layer 223 may increase as the fiber 220 passes through the tool 316. Accordingly, the thickness of the amorphous piezoelectric layer 223 may be controlled at least in part by the speed at which the fiber 220 is pulled through sputtering tool 316. Additionally, a centrosymmetric coating may be formed by rotating the fiber 220 as it passes through the deposition tool 316, as indicated by the arrow wrapping around the fiber 220. Alternatively, a non-centrosymmetric coating may be obtained by omitting the rotation or by initiating periodic rotation as the fiber 220 passes through the deposition tool 316.

Figure 3B:
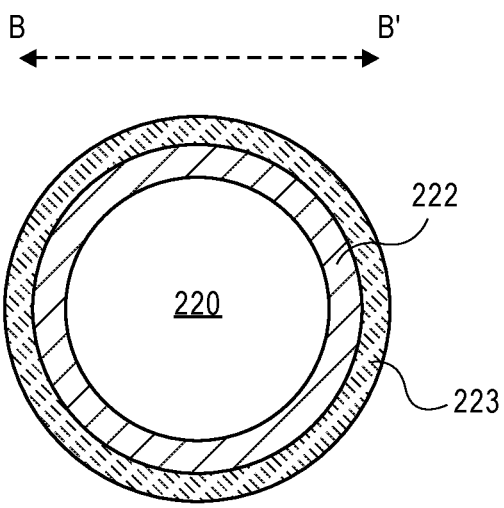
FIG. 3B is a cross-sectional illustration the fiber after an amorphous layer of piezoelectric material is deposited over the first electrode, according to an embodiment of the invention.

Referring now to FIG. 3B, a cross-sectional illustration of the fiber 220 after the amorphous piezoelectric layer 223 has been formed over the surface along line B-B' is shown, according to an embodiment of the invention. In the illustrated embodiment, a centrosymmetric piezoelectric layer 223 has been formed directly on the surface of the first electrode 222. Embodiments with a non-centrosymmetric piezoelectric layer 223 will be described in greater detail below.

Referring back to FIG. 1, embodiments of the invention may continue process 100 by advancing to operation 108. According to an embodiment, operation 108 may include crystallizing the amorphous piezoelectric layer 223 to form a crystallized piezoelectric layer 224. As noted above, high performance piezoelectric materials, such as PZT and KNN, typically require a high temperature anneal (e.g., greater than 500° C.) in order to provide the proper crystal structure to produce the piezoelectric effect. As such, previous piezoelectric coatings on fibers, such as those described above, require a fiber with a melt or draw temperature that exceeds such high temperatures (e.g., glass fibers). However, embodiments of the present invention allow for a crystallized piezoelectric layer 224 to be formed at much lower temperatures that are suitable for a wide range of fiber materials. For example, embodiments of the invention may include a pulsed laser annealing process that prevents the fiber from exceeding approximately 250° C. and if the temperature is exceeded it is for a short duration such that no deleterious interaction (e.g., melting) impacts the fiber, thereby enabling the use of low temperature fibers (e.g., organic fibers). Depending on the parameters of the pulsed laser annealing process and the material choices and configurations, the fiber may be prevented from exceeding approximately 200° C. According to an embodiment, the pulsed laser annealing process used to crystalize the amorphous piezoelectric layer 223 may use a laser source (e.g., an excimer laser) with an energy density in the range of approximately 10-100 mJ/cm$^2$ and pulse width in the range of approximately 10-50 nanoseconds.

Figure 3C:
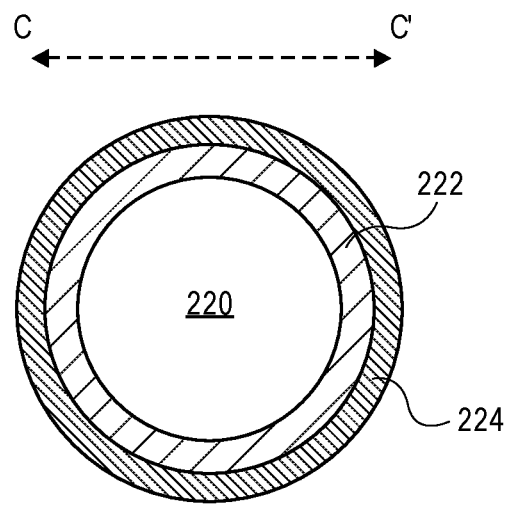
FIG. 3C is a cross-sectional illustration of the fiber after the piezoelectric material has been crystallized with a laser assisted annealing process, according to an embodiment of the invention.

According to an embodiment, the sputtering tool 316 may also include a laser source 318 for performing the laser assisted anneal, as is shown in FIG. 3A. As illustrated, the laser source 318 may emit the radiation 319 that causes the amorphous piezoelectric layer 223 to heat up and crystallize to form the crystallized piezoelectric layer 224. Controlling the pulse width and the energy density, as described above, prevents the fiber core 220 from heating up as well. In an embodiment, the fiber 220 may be rotated to ensure even annealing of the piezoelectric layer 224, as is illustrated in the cross-section view of the fiber along ling C-C' in FIG. 3C. In an alternative embodiment, the laser source 318 may be provided as a ring that encircles the fiber 220, or numerous radiation sources around the fiber may be split from one or more laser sources 318.

Figure 3D:
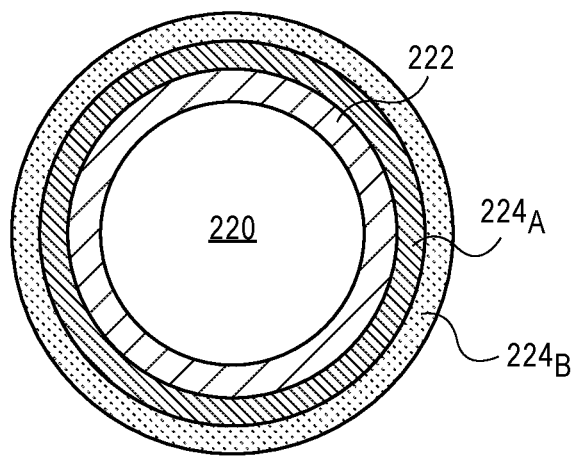
FIG. 3D is a cross-sectional illustration of the fiber after two layers of piezoelectric material have been deposited and crystallized over the first electrode, according to an embodiment of the invention.

Embodiments that include the laser source 318 in the sputtering tool 316 provide several benefits. One such benefit is that multi-layer processing may be implemented. FIG. 3D is a cross-sectional illustration of a fiber 220 that has undergone multi-layer processing to form two crystallized piezoelectric layers $224_A$ and $224_B$. Multi-layer processing may be implemented by forming a first layer crystallized piezoelectric layer $224_A$, as described above, and then retracting the fiber back through the processing tool 316 (as indicated by the double arrows in FIG. 3A and by the arrow in FIG. 1 going from process 108 back to process 106) and performing a second amorphous piezoelectric layer deposition and pulsed laser anneal crystallization process.

According to an embodiment, the first and second crystallized piezoelectric layers $224_A$ and $224_B$ may be the same piezoelectric material. Forming multiple thinner layers may allow for improved crystallization compared to a single layer of equivalent thickness. Additionally, the first and second crystallized piezoelectric layers $224_A$ and $224_B$ may be different piezoelectric materials. Forming different piezoelectric materials on the fiber may be implemented by a tool 316 that includes two or more targets 317 or by switching out the target 317 between layers. While only two crystallized piezoelectric layers $224_A$ and $224_B$ are illustrated in FIG. 3D, it is to be appreciated that more than two crystallized piezoelectric layers may be formed by repeating the deposition and annealing process as many times as desired. As such, customizable piezoelectric stacks of any number of materials and layers may be formed, according to embodiments of the invention.

Additional embodiments of the invention may also include a laser source 318 that is located in a different tool than the sputtering tool 316. In such embodiments, the fiber 220 with an amorphous piezoelectric layer 223 may be fed directly into a tool housing the laser source 318, or the fiber 220 may be spooled and annealed with a pulse laser anneal at a later time.

Figure 3E:
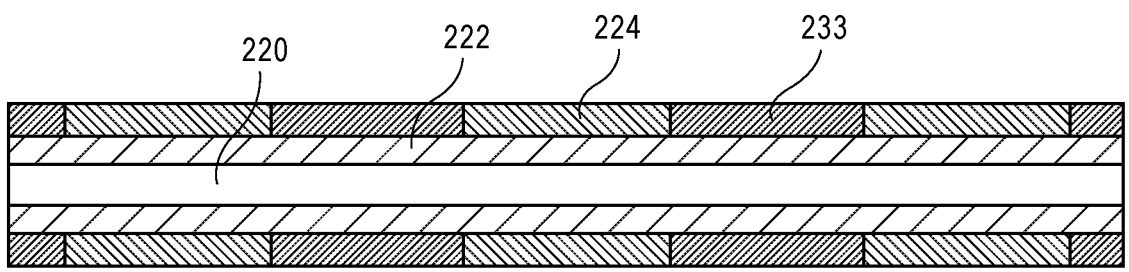
FIG. 3E is a cross-sectional illustration along the length of the fiber that shows intermittent deposition and crystallization of a piezoelectric material alternating with deposition of an insulator, according to an embodiment of the invention.

Referring now to FIG. 3E, a cross-sectional illustration along the axis of the fiber 220 is shown, according to an additional embodiment of the invention. Instead of forming a fiber 220 with a uniform cross-section throughout the entire length of the fiber 220, embodiments may also include different materials in the same layer. For example, a pattern of different materials in a single layer may be formed by changing the target 317. In the embodiment illustrated in FIG. 3E, a crystallized piezoelectric layer 224 is formed in an alternating pattern with an insulating layer 233 (e.g., an oxide). In embodiments where the deposition processing is intermittently halted while the fiber 220 is passed through the tool 316, some portions of the fiber 220 may lack a crystallized piezoelectric layer 224 (e.g., the fiber 220 may have a non-uniform coating thickness along the length of the fiber 220 when the sputtering process is halted while the fiber is pulled through the tool 316, or a portion of the piezoelectric layer may remain amorphous when the pulsed laser annealing process is halted as the fiber 220 is pulled through the tool 316).

Figure 4A:
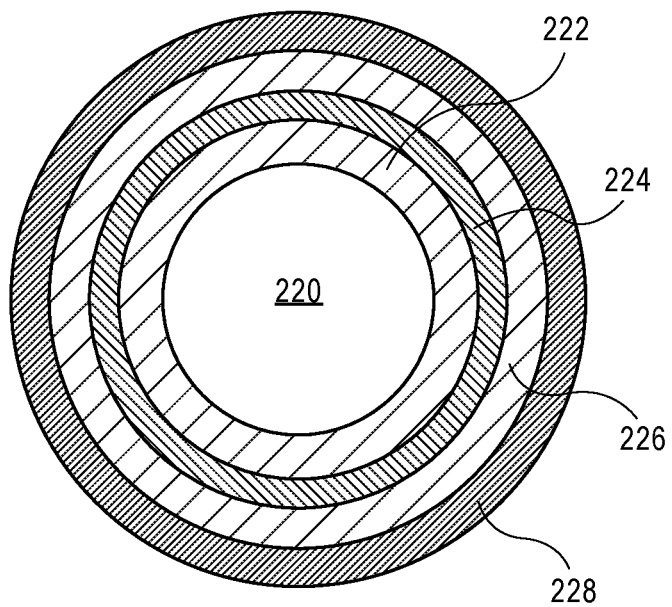
FIG. 4A is a cross-sectional illustration of a fiber after a second electrode and an insulating layer are applied over the crystallized piezoelectric material, according to an embodiment of the invention.

Referring again to FIG. 1, embodiments of the invention may continue process 100 by advancing to operation 110. According to an embodiment, operation 110 may include preparing the outer surface of the fiber 220 by depositing any additional layers needed after the piezoelectric layer 224 has been crystallized. An example of some additional layers that may be formed is illustrated in the cross-sectional view shown in FIG. 4A. For example, preparing the outer surface of the fiber 220 may include forming a second electrode 226 over the crystallized piezoelectric layer 224 and forming a protective coating 228 for electrical and environmental insulation. For example, layers applied in operation 110 may be formed with an evaporator, a CVD tool, an ALD tool, and/or RF sputter tool in a manner similar to the processing described above with respect to operation 104, and therefore, will not be repeated here.

Figure 4B:
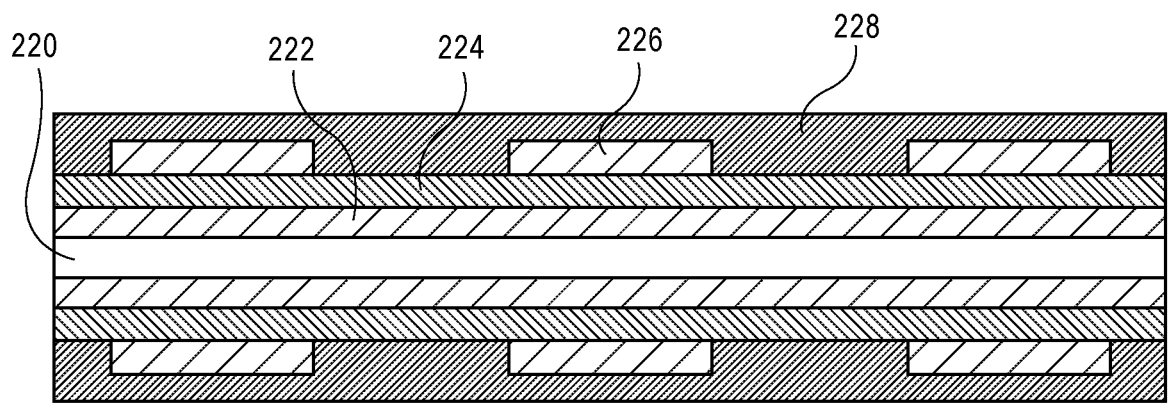
FIG. 4B is a is a cross-sectional illustration along the length of the fiber that illustrates intermittent deposition of the second electrode and an insulating layer, according to an embodiment of the invention.

Referring now to FIG. 4B, a cross-sectional illustration along the axis of the fiber 220 is shown, according to an additional embodiment of the invention. Instead of forming a fiber 220 with a uniform cross-section throughout the entire length of the fiber 220, embodiments may also include different materials in the same layer. In the embodiment illustrated in FIG. 4B, the processing gasses alternated between processing gasses used to form a protective coating 228 and a second electrode layer 226. The formation of a non-uniform cross-section similar to the one illustrated in FIG. 4B may be formed in substantially the same manner as described above with respect to FIG. 2D, and therefore, will not be repeated here.

Figure 5A:
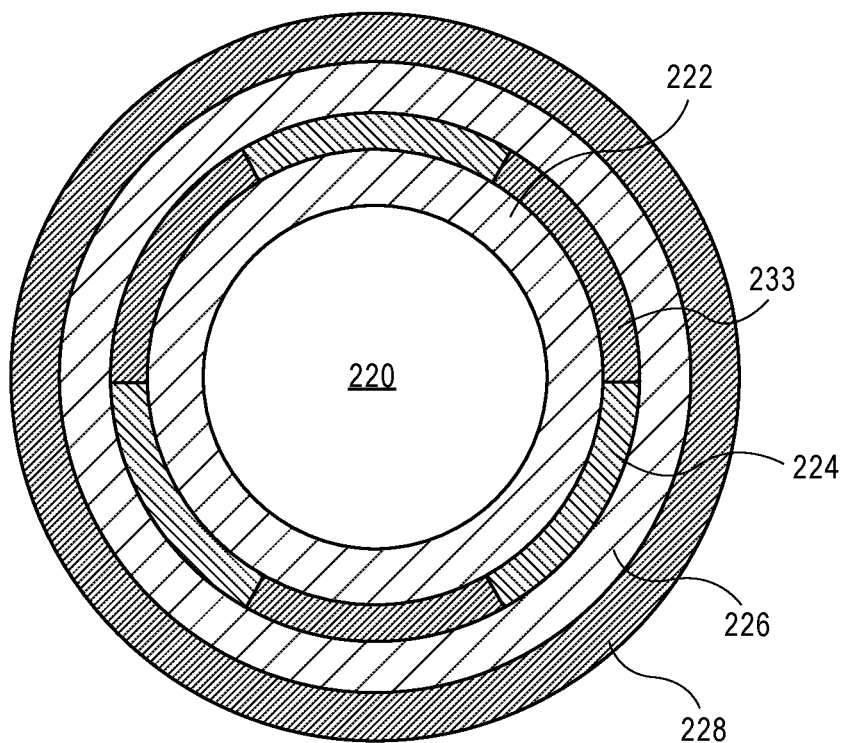
FIG. 5A is a cross-sectional illustration of a fiber that includes a non-centrosymmetric piezoelectric layer, according to an embodiment of the invention.
Figure 5B:
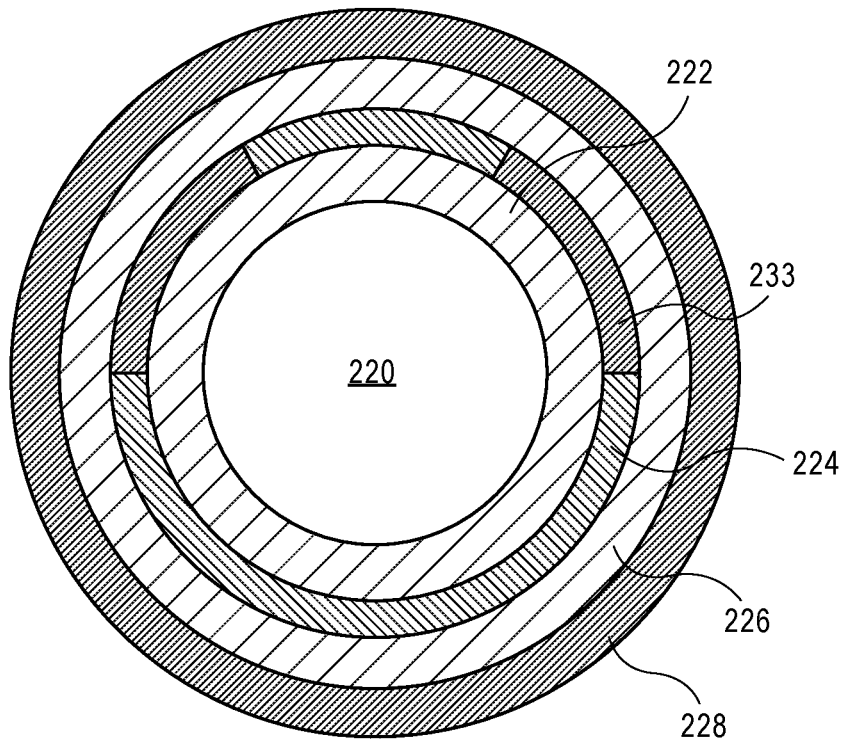
FIG. 5B is a cross-sectional illustration of a fiber that includes a non-centrosymmetric piezoelectric layer, according to an additional embodiment of the invention.

As noted above, some embodiments of the invention may include non-centrosymmetric layers formed around the fiber 220 that are produced by ceasing rotation of the fiber 220 or by initiating periodic rotation. Exemplary illustrations of such embodiments are shown in FIGS. 5A and 5B. For example, in FIG. 5A, the crystallized piezoelectric layer 224 is separated into three distinct regions that are equally spaced apart from each other by an insulating layer 233. In FIG. 5A the regions of the crystallized piezoelectric layer 224 are substantially the same size. However, embodiments of the invention are not limited to such configurations, and embodiments may include a layer with any number of distinct regions, size distribution (e.g., percentage of the circumference covered or thickness), or spacing. For example, in FIG. 5B, a first portion of the crystallized piezoelectric layer 224 on the upper half of the circumference is substantially smaller than a second portion of the crystallized piezoelectric layer on the bottom half of the circumference. Additionally, while non-centrosymmetric regions are shown in the crystallized piezoelectric layer 224, it is to be appreciated that any layer or more than one layer may be non-centrosymmetric.

After the second electrode 226 has been formed, the fiber 220 may be considered an active fiber. For example, applying a voltage across the first and second electrodes 222, 226 will induces a strain in the portions of the crystallized piezoelectric layer 224 formed between the two electrodes, thereby causing the fiber to deform in a predictable manner. Alternatively, deformation of the active fiber caused by external forces may monitored or used as a power source. For example, deformation of the active fiber will generate strain in the crystallized piezoelectric layer 224 which produces a voltage across the crystallized piezoelectric layer 224, which can be picked up by the first and second electrodes 222, 226. Accordingly changes in the voltage across the first and second electrodes 222, 226 may be used to monitor the deformation of the active fiber or be used to drive a component that is electrically coupled to the first and second electrodes of the active fiber. As such, embodiments of the invention allow for high performance active fibers formed with fibers 220 that have a melt or draw temperature lower than the crystallization temperature of the piezoelectric material to be used in devices such as, but not limited to, voltage sensors, ultra-sonic or audio transducers or receivers, wearable nanogenerators, Fabry-Perot tunable filters, phase modulators, stress concentrators, refractive index changers, and tunable reflectors.

Figure 6:
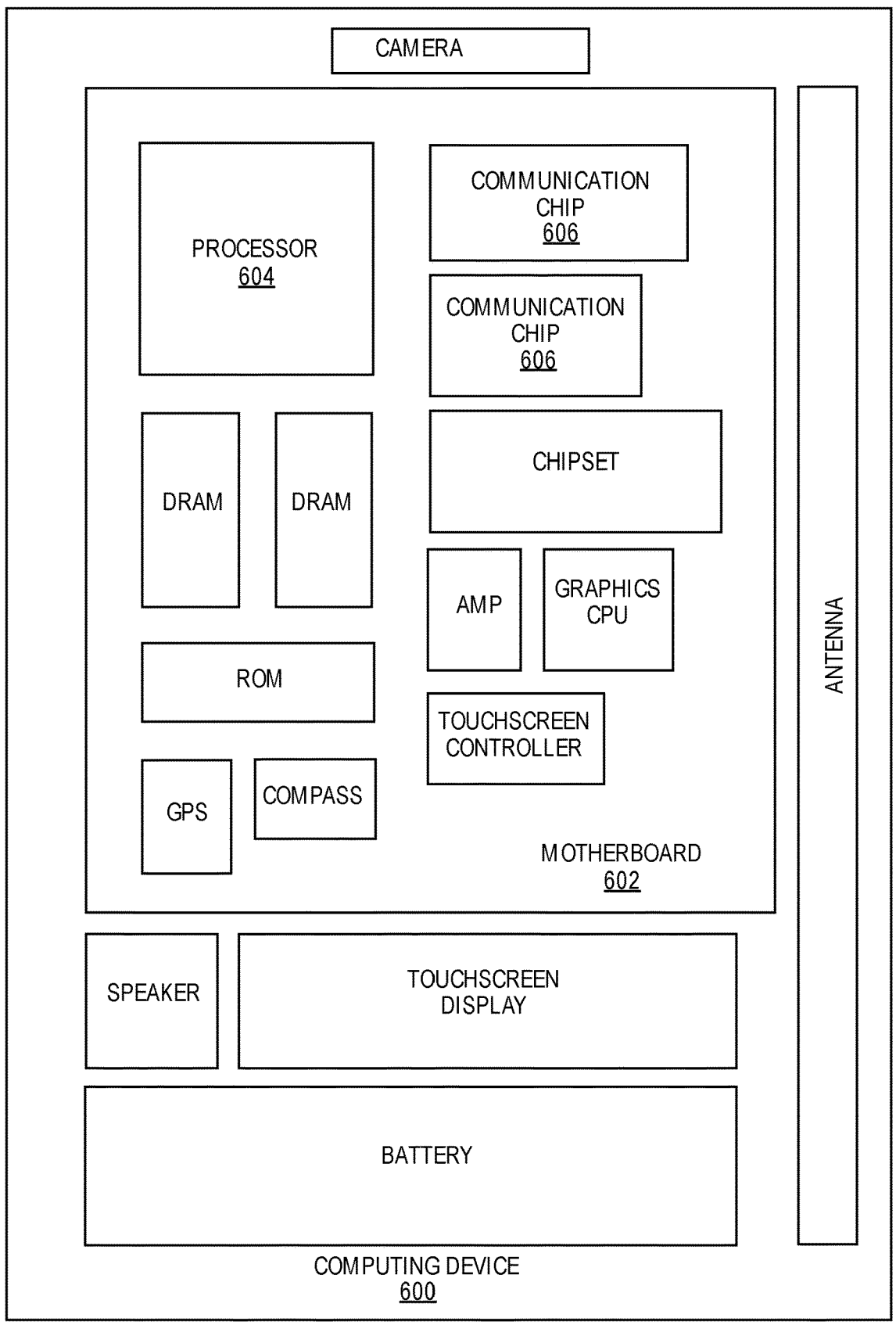
FIG. 6 is a schematic of a computing device built in accordance with an embodiment of the invention.

FIG. 6 illustrates a computing device 600 that may be used in conjunction with an active fiber formed in accordance with implementations of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor may be electrically coupled to a first and second electrode of one or more active fibers that include a fiber with a melt or draw temperature lower than the crystallization temperature of a piezoelectric material deposited on the fiber, in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip may be electrically coupled to a first and second electrode of one or more active fibers that include a fiber with a melt or draw temperature lower than the crystallization temperature of a piezoelectric material deposited on the fiber, in accordance with implementations of the invention.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention include a method of forming an active fiber, comprising: forming a first electrode over an outer surface of a fiber; depositing a first amorphous piezoelectric layer over the first electrode; crystallizing the first amorphous piezoelectric layer with a pulsed laser annealing process to form a first crystallized piezoelectric layer, wherein the crystallization temperature of the amorphous piezoelectric material is greater than a melt or a draw temperature of the fiber; and forming a second electrode over an outer surface of the crystallized piezoelectric layer.

Additional embodiments of the invention include a method of forming an active fiber, further comprising: forming a thermal insulation layer between the outer surface of the fiber and the first electrode.

Additional embodiments of the invention include a method of forming an active fiber, further comprising: forming a crystal nucleation enhancement layer between an outer surface of the first electrode and the amorphous piezoelectric layer.

Additional embodiments of the invention include a method of forming an active fiber, wherein the deposition of the first amorphous piezoelectric layer and the crystallization of the first amorphous piezoelectric occur in the same processing tool.

Additional embodiments of the invention include a method of forming an active fiber, further comprising: depositing a second amorphous piezoelectric layer over the first crystallized piezoelectric layer; and crystallizing the second amorphous piezoelectric layer with a pulsed laser annealing process to form a second crystallized piezoelectric layer.

Additional embodiments of the invention include a method of forming an active fiber, wherein the first crystallized piezoelectric layer is a different material than the second crystallized piezoelectric layer.

Additional embodiments of the invention include a method of forming an active fiber, wherein the first crystallized piezoelectric layer is the same material as the second crystallized piezoelectric layer.

Additional embodiments of the invention include a method of forming an active fiber, wherein the fiber is an organic fiber and wherein the crystallized piezoelectric layer is lead zirconate titanate (PZT) or sodium potassium niobate (KNN).

Additional embodiments of the invention include a method of forming an active fiber, wherein one or more of the first electrode, the first crystallized piezoelectric layer, and the second electrode are non-centrosymmetric layers.

Additional embodiments of the invention include a method of forming an active fiber, wherein the non-centrosymmetric layers are formed by either not rotating the fiber during the formation of the non-centrosymmetric layer or by periodically rotating the fiber during the formation of the non-centrosymmetric layer.

Additional embodiments of the invention include a method of forming an active fiber, wherein one or more of the first electrode, the first crystallized piezoelectric layer, and the second electrode are not continuous along the length of the active fiber.

Additional embodiments of the invention include a method of forming an active fiber, wherein the non-continuous layers are patterned by intermittently ceasing the processing operation used to form the non-continuous layer as the fiber is passed through a processing tool.

Additional embodiments of the invention include a method of forming an active fiber, further comprising: forming the fiber with a spinning process.

Additional embodiments of the invention include a method of forming an active fiber, wherein the spinning process is a wet spinning process, a dry spinning process, a melt spinning process, or a gel spinning process.

Additional embodiments of the invention include a method of forming an active fiber, wherein the pulsed laser annealing process comprises:

exposing the first amorphous piezoelectric layer to radiation from an excimer laser with an energy density between approximately 10 and 100 mJ/cm$^2$ and pulse width between approximately 10 and 50 nanoseconds.

Embodiments of the invention include an active fiber comprising: a fiber; a first electrode formed over the fiber; a first crystallized piezoelectric layer formed over the first electrode, wherein the crystallization temperature of the first crystallized piezoelectric layer is greater than a melt or draw temperature of the fiber; and a second electrode formed over the first crystallized piezoelectric layer.

Additional embodiments of the invention include an active fiber, further comprising: a second crystalized piezoelectric layer formed over the first crystallized piezoelectric layer.

Additional embodiments of the invention include an active fiber, wherein the first crystallized piezoelectric layer is a different material than the second crystallized piezoelectric layer.

Additional embodiments of the invention include an active fiber, wherein the first crystallized piezoelectric layer is the same material as the second crystallized piezoelectric layer.

Additional embodiments of the invention include an active fiber, further comprising: a thermal insulation layer between the outer surface of the fiber and the first electrode; and a crystal nucleation enhancement layer between an outer surface of the first electrode and the amorphous piezoelectric layer.

Additional embodiments of the invention include an active fiber, wherein one or more of the first electrode, the first crystallized piezoelectric layer, and the second electrode are non-centrosymmetric layers.

Additional embodiments of the invention include an active fiber, wherein one or more of the first electrode, the first crystallized piezoelectric layer, and the second electrode are not continuous along the length of the active fiber.

Embodiments of the invention include an active fiber system, comprising: a fiber;
a first electrode formed over the fiber; a first crystallized piezoelectric layer formed over the first electrode, wherein the crystallization temperature of the first crystallized piezoelectric layer is greater than a melt or draw temperature of the fiber; a second electrode formed over the first crystallized piezoelectric layer; and an integrated circuit die electrically coupled to the first electrode and the second electrode.

Additional embodiments of the invention include an active fiber system, wherein the fiber is an organic fiber and wherein the crystallized piezoelectric layer is lead zirconate titanate (PZT) or sodium potassium niobate (KNN).

Additional embodiments of the invention include an active fiber system, further comprising: a second crystalized piezoelectric layer formed over the first crystallized piezoelectric layer, wherein the first crystallized piezoelectric layer is a different material than the second crystallized piezoelectric layer.

What is claimed is:

1. An active fiber comprising:
a fiber;
a first electrode formed over the fiber;
a first crystallized piezoelectric layer formed over the first electrode, wherein the crystallization temperature of the first crystallized piezoelectric layer is greater than a melt or draw temperature of the fiber; and
a second electrode formed over the first crystallized piezoelectric layer.

2. The active fiber of claim 1, further comprising:
a second crystalized piezoelectric layer formed over the first crystallized piezoelectric layer.

3. The active fiber of claim 2, wherein the first crystallized piezoelectric layer is a different material than the second crystallized piezoelectric layer.

4. The active fiber of claim 2, wherein the first crystallized piezoelectric layer is the same material as the second crystallized piezoelectric layer.

5. The active fiber of claim 1, further comprising:
a thermal insulation layer between the outer surface of the fiber and the first electrode; and
a crystal nucleation enhancement layer between an outer surface of the first electrode and the amorphous piezoelectric layer.

6. The active fiber of claim 1, wherein one or more of the first electrode, the first crystallized piezoelectric layer, and the second electrode are non-centrosymmetric layers.

7. The active fiber of claim 1, wherein one or more of the first electrode, the first crystallized piezoelectric layer, and the second electrode are not continuous along the length of the active fiber.

8. An active fiber system, comprising:
a fiber; a first electrode formed over the fiber;
a first crystallized piezoelectric layer formed over the first electrode, wherein the crystallization temperature of the first crystallized piezoelectric layer is greater than a melt or draw temperature of the fiber;
a second electrode formed over the first crystallized piezoelectric layer; and
an integrated circuit die electrically coupled to the first electrode and the second electrode.

9. The active fiber system of claim 8, wherein the fiber is an organic fiber and wherein the crystallized piezoelectric layer is lead zirconate titanate (PZT) or sodium potassium niobate (KNN).

10. The active fiber system of claim 8, further comprising:
a second crystalized piezoelectric layer formed over the first crystallized piezoelectric layer, wherein the first crystallized piezoelectric layer is a different material than the second crystallized piezoelectric layer.

* * * * *